United States Patent
Li et al.

(10) Patent No.: US 12,283,957 B2
(45) Date of Patent: Apr. 22, 2025

(54) INTERFACE DEVICE AND SIGNAL TRANSCEIVING METHOD THEREOF

(71) Applicants: Global Unichip Corporation, Hsinchu (TW); Taiwan Semiconductor Manufacturing Company, Ltd., Hsinchu (TW)

(72) Inventors: Bi-Yang Li, Hsinchu (TW); Igor Elkanovich, Hsinchu (TW); Hung-Yi Chang, Hsinchu (TW); Shih-Cheng Kao, Hsinchu (TW)

(73) Assignees: Global Unichip Corporation, Hsinchu (TW); Taiwan Semiconductor Manufacturing Company, Ltd., Hsinchu (TW)

( * ) Notice: Subject to any disclaimer, the term of this patent is extended or adjusted under 35 U.S.C. 154(b) by 356 days.

(21) Appl. No.: 17/899,623

(22) Filed: Aug. 31, 2022

(65) Prior Publication Data

US 2024/0072772 A1 Feb. 29, 2024

(51) Int. Cl.
*H03K 3/012* (2006.01)
*G06F 1/10* (2006.01)
(Continued)

(52) U.S. Cl.
CPC ............... *H03K 3/012* (2013.01); *G06F 1/10* (2013.01); *H03K 5/14* (2013.01); *H03L 7/0812* (2013.01); *H03K 2005/00019* (2013.01)

(58) Field of Classification Search
CPC ..................... H03K 3/012; H03K 5/14; H03K 2005/00019; H03K 5/135; H03K 3/0372;
(Continued)

(56) References Cited

U.S. PATENT DOCUMENTS 5,570,054 A * 10/1996 Takla ........................ H03L 7/07
327/295
6,643,787 B1 * 11/2003 Zerbe .................. G06F 13/4243
713/400
(Continued)

FOREIGN PATENT DOCUMENTS

CN 108806759 5/2022
TW 202129509 8/2021
(Continued)

OTHER PUBLICATIONS

"Office Action of Taiwan Counterpart Application", issued on Mar. 13, 2023, p. 1-p. 5.

*Primary Examiner* — John W Poos
(74) *Attorney, Agent, or Firm* — JCIPRNET

(57) ABSTRACT

An interface device and a signal transceiving method thereof are provided. The interface device includes a slave circuit and a master circuit. The slave circuit is coupled to the master circuit and includes a first programmable delay line, a first output clock generator, and a first phase detector. The first programmable delay line provides a first adjusting delay amount according to a first adjust signal, and generates a first delayed clock signal by delaying a first clock signal according to the first adjusting delay amount. The first output clock generator generates a second clock signal according to the first delayed clock signal. The first phase detector detects a phase difference of the first clock signal and the second clock signal to generate first phase lead or lag information. The first adjust signal is generated according to the first phase lead or lag information.

18 Claims, 6 Drawing Sheets

(51) Int. Cl.
H03K 5/14 (2014.01)
H03L 7/081 (2006.01)
H03K 5/00 (2006.01)

(58) Field of Classification Search
CPC .. H03K 5/22; H03K 2005/00013; H03K 5/13; H03K 19/0008; H03K 19/017509; G06F 1/10; H03L 7/0812; H03L 7/0807; H03L 7/081; H03L 7/083; H03L 7/091; H03L 7/097; H03L 7/0998; G11C 7/222; G11C 7/1066; G11C 11/4076; G11C 11/4093; G11C 2207/2254; G11C 29/023; G11C 7/1051; G11C 7/106; G11C 29/12015; G11C 7/1093; G11C 2207/108; G11C 2207/2281; G11C 29/028; G11C 7/1057; G11C 7/22; G11C 11/4074; G11C 11/409; G11C 16/32; G11C 19/28; G11C 2029/0409; G11C 2207/2272; G11C 29/02; G11C 29/50012; G11C 7/1039; G11C 7/1084; G11C 7/1087; G11C 7/109; G11C 7/225; G11C 8/18; G11C 11/4096; G11C 2207/105; G11C 29/022; G11C 29/1201; G11C 5/025; G11C 5/063; G11C 7/10; G11C 7/1048

See application file for complete search history.

(56) References Cited

U.S. PATENT DOCUMENTS

| | | | |
|---|---|---|---|
| 2008/0226004 | A1* | 9/2008 | Oh .................. H03L 7/0814 375/354 |
| 2016/0196857 | A1* | 7/2016 | Lee .................. G11C 8/18 365/189.05 |
| 2022/0076769 | A1 | 3/2022 | Park et al. |

FOREIGN PATENT DOCUMENTS

| | | |
|---|---|---|
| TW | 202207224 | 2/2022 |
| TW | 202209317 | 3/2022 |

* cited by examiner

INTERFACE DEVICE AND SIGNAL TRANSCEIVING METHOD THEREOF

BACKGROUND

Technical Field

The disclosure relates to an interface device and a signal transceiving method thereof, and more particularly to an interface device and a signal transceiving method thereof, which can reduce circuit layout area and power consumption.

Description of Related Art

In the prior art, in the physical layer of a memory circuit, a clock tree circuit is often required to generate a clock signal for sampling a data signal. Based on the transmission delay generated during a transmission process, in a three-dimensionally stacked semiconductor element, the data signal transmitted between master and slave circuits is misaligned with the clock signal. In such a case, it is often necessary to add a delay line between the transmission paths of the data signal to adjust the transmission time of the data signal, so as to align the data signal with the clock signal.

However, since the data signal often has multiple bits, under such a condition, a large number of delay lines need to be disposed between the master and slave circuits, which consumes a large amount of layout area. Moreover, when the data signal transitions, the delay lines also generate unnecessary power consumption due to the transition of the data signal, which reduces the work efficiency of the semiconductor element.

SUMMARY

The disclosure provides an interface device and a signal transceiving method thereof, which can effectively reduce circuit area and required power consumption.

The interface device is applied for a semiconductor device, the semiconductor device including a master device and a plurality of slave devices, wherein the master device and the slave devices are stacked up with electric connection to form a three-dimension structure. The interface device of the disclosure includes a slave circuit and a master circuit. The master circuit is implemented in the master device. The slave circuit implemented in each of the slave devices is coupled to the master circuit through a plurality of through silicon vias. The slave circuit includes a first programmable delay line, a first output clock generator, and a first phase detector. The first programmable delay line provides a first adjusting delay amount according to a first adjust signal, and generates a first delayed clock signal by delaying a first clock signal according to the first adjusting delay amount. The first output clock generator is coupled to the first programmable delay line, and generates a second clock signal according to the first delayed clock signal. The first phase detector detects a phase difference of the first clock signal and the second clock signal to generate first phase lead or lag information. The first adjust signal is generated according to the first phase lead or lag information.

The signal transceiving method of the disclosure includes the following steps. A first adjusting delay amount is provided according to a first adjust signal, and a first delayed clock signal is generated by delaying a first clock signal according to the first adjusting delay amount. A second clock signal is generated according to the first delayed clock signal. A phase difference of the first clock signal and the second clock signal is detected to generate first phase lead or lag information. The first adjust signal is generated according to the first phase lead or lag information.

Based on the above, the interface device of the disclosure delays the clock signal through the programmable delay line, and adjusts the adjusting delay amount provided by the programmable delay line through the adjust signal, so as to generate the correct clock signal to sample the data signal sent by the master circuit. In this way, the interface device does not need to be provided with a large number of delayers to delay multiple bits of the data signal, which can effectively reduce the area required for circuit layout and reduce the power consumption in the delayer due to the transition of the data signal.

DESCRIPTION OF THE EMBODIMENTS

Figure 1:
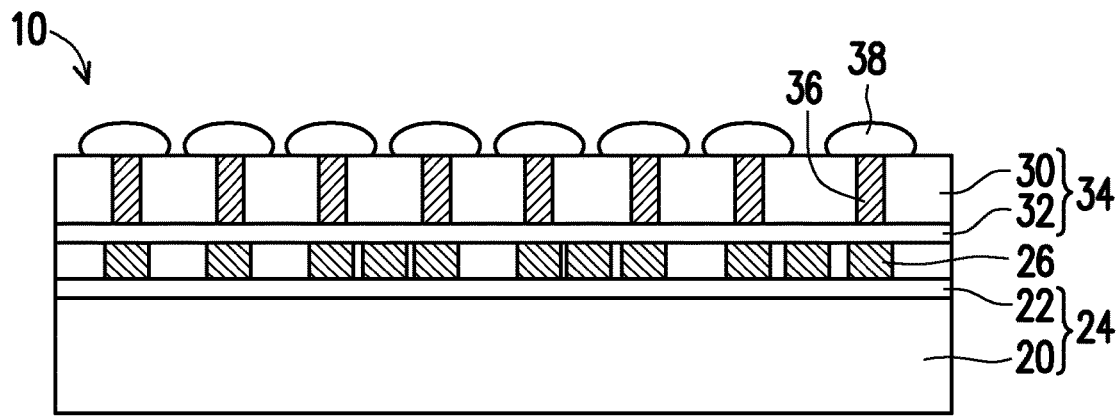
FIG. 1 is a schematic diagram of a semiconductor element with a three-dimensional structure in a cross-sectional view according to an embodiment of the disclosure.

Please refer to FIG. 1. FIG. 1 is a schematic diagram of a semiconductor element with a three-dimensional structure in a cross-sectional view according to an embodiment of the disclosure. A three-dimensional semiconductor element 10 may include a device 24 and multiple devices 34. In addition to the horizontal distribution among the circuits, the devices 24 and the devices 34 may also be stacked together vertically. Therefore, a three-dimensional semiconductor element including multiple circuits may be formed.

In an embodiment, a device 24 may be regarded as a master device, and the device 24 generally includes a substrate 20 and a circuit layer 22. Several other devices 34, such as acting as slave devices, are stacked on the device 24, wherein a via structure based on a packaging process, such as a through silicon via 26 with a connection pad portion, is formed between the device 24 and the device 34. The device 34 includes a substrate 30 and a circuit layer 32, and may further include a through silicon via 36 at a corresponding position to be electrically connected to the device 24. In addition, the connection pad portion 38 may also be formed at an outermost surface position corresponding to the through silicon via 36.

A three-dimensional packaging technique, such as system-on-integrated-chips (SoIC) packaging, wafer-on-wafer (WoW) packaging, and chip-on-wafer-on-substrate (CoWoS) packaging, is proposed in various stacking structures. The disclosure is based on three-dimensional packaging, but does not limit the type of the three-dimensional packaging.

Figure 2:
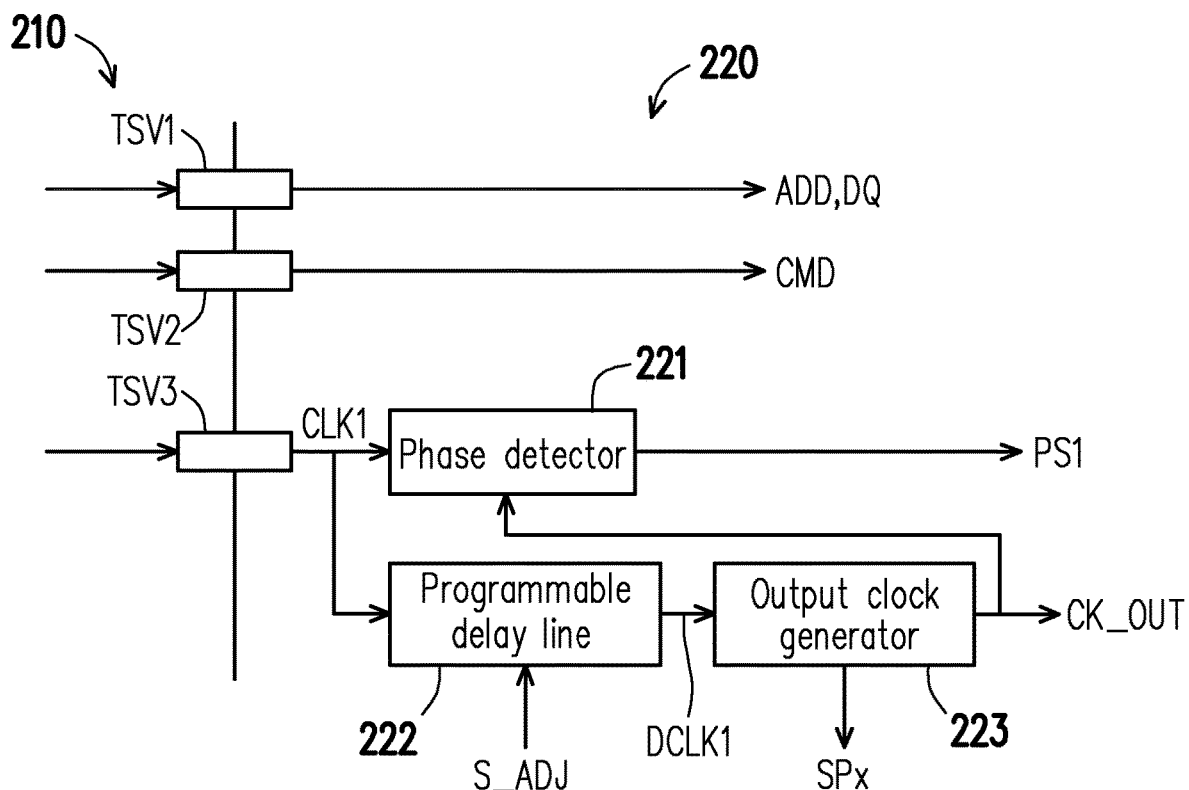
FIG. 2 is a schematic diagram of an interface device according to an embodiment of the disclosure.

Please refer to FIG. 2. FIG. 2 is a schematic diagram of an interface device according to an embodiment of the disclosure. An interface device 200 may be constructed in the semiconductor device with the three-dimensional structure as shown in FIG. 1. The semiconductor device may include a master device and a plurality of slave devices, wherein the master device and the slave devices are stacked up with electric connection. The interface device 200 includes a master circuit 210 implemented in the master device and a slave circuit 220 implemented in each of the slave devices that are coupled to each other through multiple through silicon vias TSV1 to TSV3. In the embodiment, the slave circuit 220 may receive a data signal ADD or DQ sent by the master circuit 210 through the through silicon via TSV1, and the slave circuit 220 may receive a data signal CMD sent by the master circuit 210 through the through silicon via TSV2. The data signal ADD may be an address signal, the data signal DQ may be general data, and the data signal CMD may be a command signal.

In the embodiment of the disclosure, the slave circuit 220 includes a phase detector 221, a programmable delay line 222, and an output clock generator 223. The phase detector 221 and the programmable delay line 222 are coupled to the through silicon via TSV3, and receive a clock signal CLK1 sent by the master circuit through the through silicon via TSV3. The programmable delay line 222 further receives an adjust signal S_ADJ, provides an adjusting delay amount according to the adjust signal S_ADJ, and generates a delayed clock signal DCLK1 by delaying the clock signal CLK1 according to the adjusting delay amount.

In the embodiment, the programmable delay line 222 may increase or decrease the provided adjusting delay amount according to the adjust signal S_ADJ.

On the other hand, the output clock generator 223 is coupled to the programmable delay line 222. The output clock generator 223 receives the delayed clock signal DCLK1, and generates a clock signal CK_OUT according to the delayed clock signal DCLK1. The slave circuit 220 may use the clock signal CK_OUT as the basis for sampling the data signals ADD, DQ, and CMD. In detail, the output clock generator 223 may also generate one or more sampling signals SPx according to the delayed clock signal DCLK1, so as to execute sampling actions of the data signals ADD and DQ.

The phase detector 221 is further coupled to the output clock generator 223. The phase detector 221 receives the clock signal CLK1 and the clock signal CK_OUT generated by the output clock generator 223, and detects a phase difference of the clock signal CLK1 and the clock signal CK_OUT to generate phase lead or lag information PS1.

In the embodiment, the adjust signal S_ADJ may be generated according to the phase lead or lag information PS1, and the adjusting delay amount provided by the programmable delay line 222 is adjusted through the adjust signal S_ADJ, so that the slave circuit 220 may correctly sample the data signals ADD, DQ, and CMD according to sampling signals SPx and the clock signal CK_OUT.

It is worth mentioning that in the embodiment, the slave circuit 220 generates the clock signal CK_OUT used as the basis for sampling the data signals ADD, DQ, and CMD by delaying the single clock signal CLK1. It is not necessary to dispose a delay line corresponding to each bit of the data signals ADD, DQ, and CMD, which can effectively reduce the area of the circuit layout and reduce unnecessary power consumption in the delay lines due to the transition of the data signals ADD, DQ, and CMD.

Figure 3A:
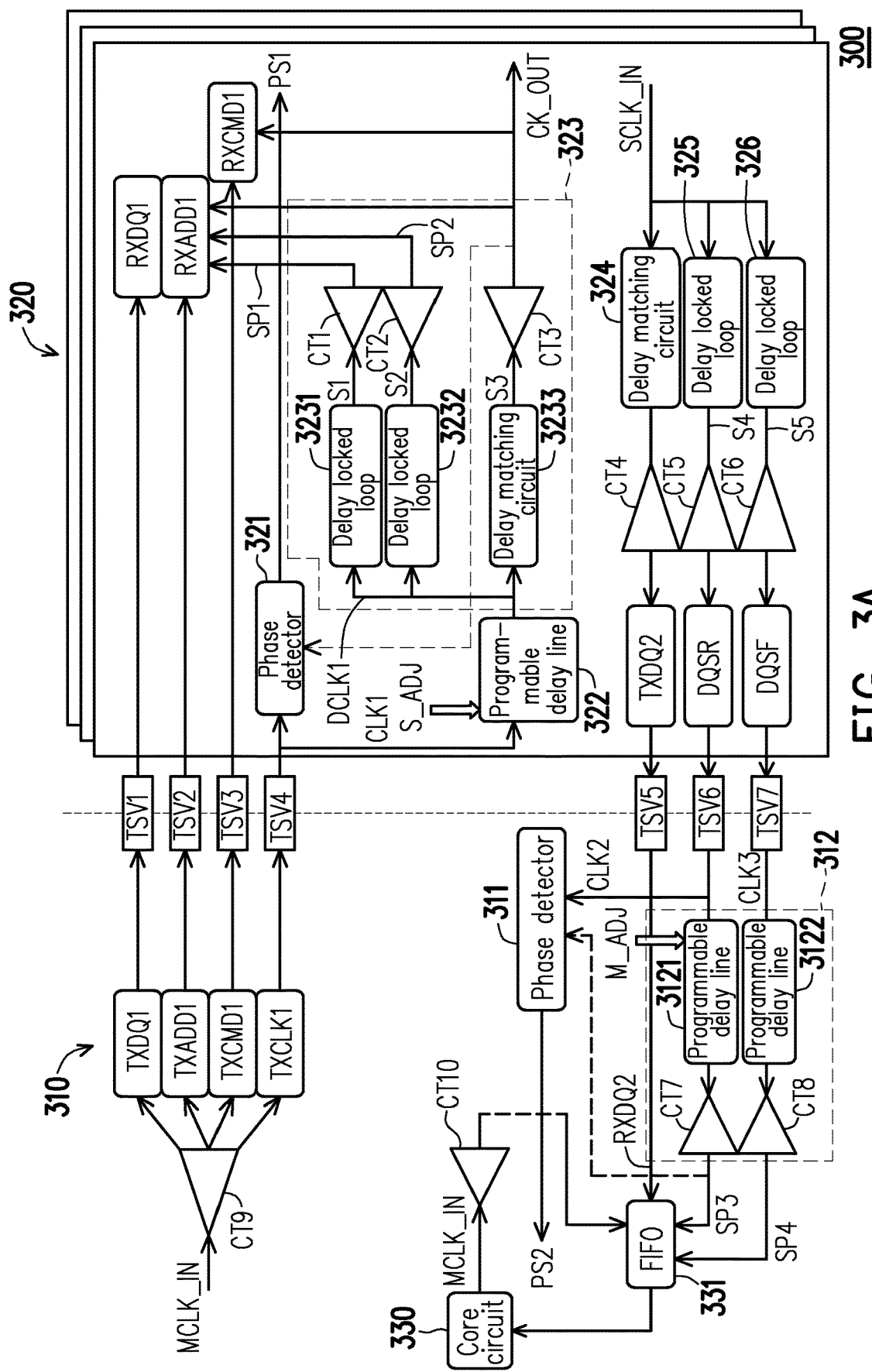
FIG. 3A and FIG. 3B are schematic diagrams of interface device according to different embodiments of the disclosure.
Figure 3B:
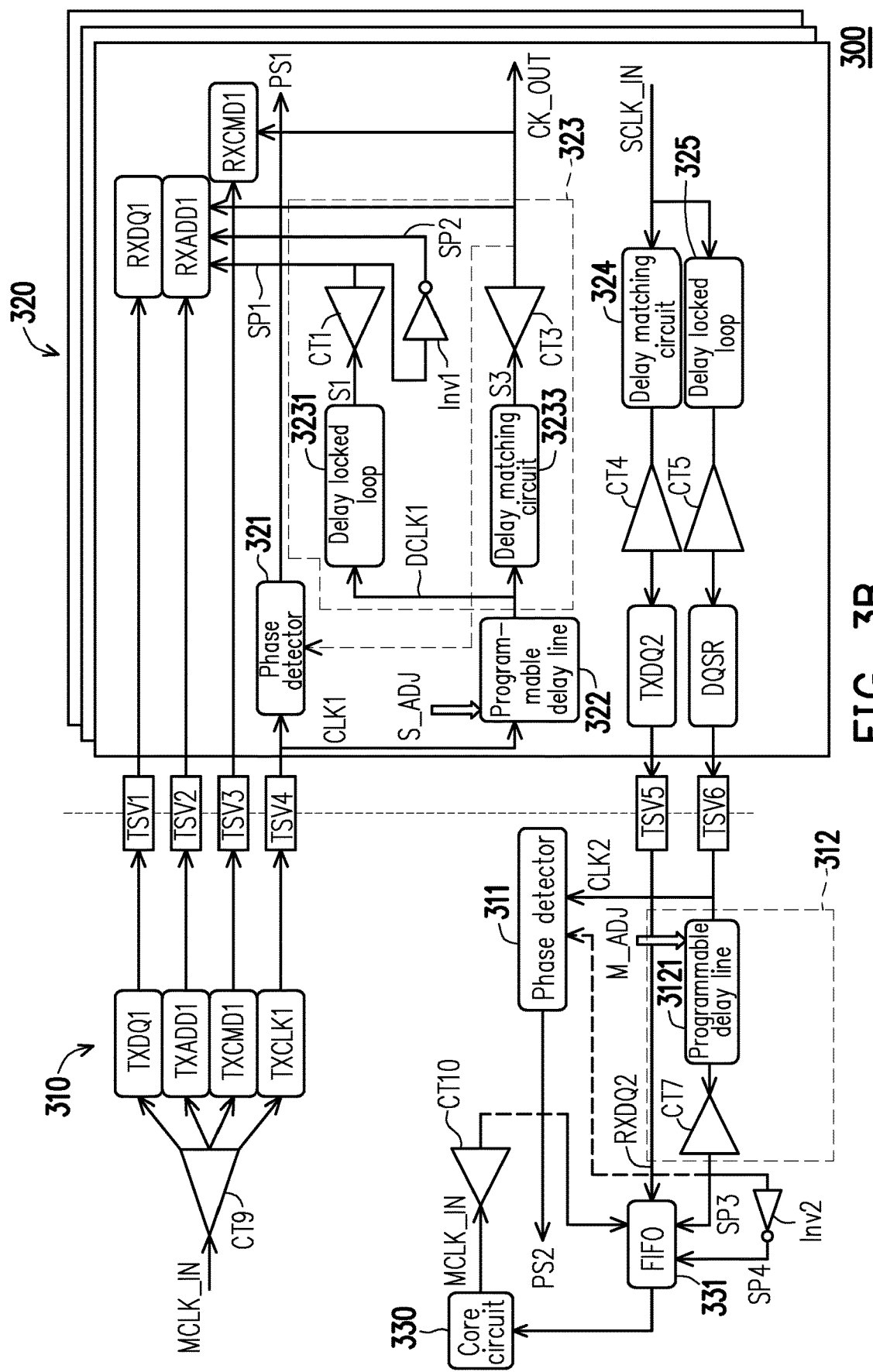

Please refer to FIG. 3A and FIG. 3B shown as below. FIG. 3A and FIG. 3B are schematic diagrams of interface device according to different embodiments of the disclosure. In FIG. 3A, an interface device 300 includes a master circuit 310 and at least one slave circuit 320. The master circuit 310 and the slave circuit 320 are coupled to each other through multiple through silicon vias TSV1 to TSV7. If number of the slave circuit 320 is larger than 1, the slave circuits 320 may be stacked in a 3D structure. In the embodiment, the slave circuit 320 receives a data signal RXDQ1 through the through silicon via TSV1, receives a data signal RXADD1 through the through silicon via TSV2, receives a data signal RXCMD1 through the through silicon via TSV3, and receives a clock signal CLK1 through the through silicon via TSV4. The slave circuit 320 includes a phase detector 321, a programmable delay line 322, an output clock generator 323, a delay matching circuit 324, delay locked loops 325 and 326, and clock tree circuits CT4 to CT6.

The programmable delay line 322 is coupled to the through silicon via TSV4 to receive the clock signal CLK1. The programmable delay line 322 sets and adjusts a provided adjusting delay amount according to an adjust signal S_ADJ, and generates a delayed clock signal DCLK1 by delaying the clock signal CLK1 according to the adjusting delay amount. The programmable delay line 322 sends the delayed clock signal DCLK1 to the output clock generator 323.

In the embodiment, the output clock generator 323 includes delay locked loops 3231 and 3232, a delay matching circuit 3233, and clock tree circuits CT1 to CT3. The delay locked loops 3231 and 3232 and the delay matching circuit 3233 are coupled to the programmable delay line 322 in parallel, and synchronously receive the delayed clock signal DCLK1. The delay locked loop 3231 may be used to delay a phase of the delayed clock signal DCLK1 by 90 degrees to generate a signal S1. The delay locked loop 3232 may be used to delay a phase of the delayed clock signal DCLK1 by 270 degrees to generate a signal S2. The clock tree circuits CT1 and CT2 are respectively coupled to the delay locked loops 3231 and 3232. The clock tree circuit CT1 receives the signal S1 and generates a sampling signal SP1 according to the signal S1. The clock tree circuit CT2 receives the signal S2 and generates a sampling signal SP2 according to the signal S2. In this embodiment, the delay locked loop 3232 may make a phase shift with 180 degrees with the delay locked loop 3231. That is, a phase of the sampling signal SP1 may be earlier than a phase of the sampling signal SP2 with 180 degrees.

In some embodiment, an inverter may be disposed between the programmable delay line 322 and the delay locked loop 3232 for making a phase shift with 180 degrees between the delay locked loop 3232 and the delay locked loop 3231. The delay locked loop 3232 may receive an inverted delayed clock signal inverted by the inverter, and a delay line depth of the delay locked loop 3232 may be reduced.

On the other hand, the delay matching circuit 3233 is used to provide a matching delay amount, wherein the matching delay amount of the delay matching circuit 3233 may be set substantially equal to the delay amount of each of the delay locked loops 3231 and 3232 with 0 degree. The delay matching circuit 3233 used to delay the delayed clock signal DCLK1 by 0 degree according to the matching delay amount to generate a signal S3. The delay matching circuit 3233 then sends the signal S3 to the clock tree circuit CT3. The clock tree circuit CT3 may generate the clock signal CK_OUT according to the signal S3. In this embodiment, a phase of the clock signal CK_OUT may be earlier than the phase of the sampling signal SP1 with 90 degrees. The matching delay of the delay matching circuit 324 may be set substantially equal to the delay amount of each of the delay locked loops 325 and 326 with 0 degree.

In the embodiment, the slave circuit 320 may provide the sampling signals SP1 and SP2 to sample the data signals RXDQ1, RXADD1 with double data rate, and provides the clock signal CK_OUT as a basis for re-sampling the data signals RXDQ1, RXADD1 and sampling the data signal RXCMD1.

In addition, in the embodiment, the phase detector 321 may receive the clock signals CK_OUT and CLK1. Through detecting a phase difference of the clock signals CK_OUT and CLK1, the phase detector 321 may generate phase lead or lag information PS1. It is worth mentioning that in the embodiment, the adjust signal S_ADJ may be adjusted according to the phase lead or lag information PS1, wherein the phase lead or lag information PS1 may have the related information of whether the phase of the clock signal CK_OUT leads or lags the phase of the clock signal CLK1.

The programmable delay line 322 may increase or decrease the provided adjusting delay amount according to the adjust signal S_ADJ, so that the sampling signals SP1 and SP2 generated according to the delayed clock signal DCLK1 may be center aligned with the data signals RXDQ1, RXADD1. The clock signal CK_OUT may be edge aligned with the data signal RXCMD1, and sampling actions may be correctly and effectively performed for the data signals RXDQ1, RXADD1, and RXCMD1.

It should be noted here that through the adjustment action of the adjusting delay amount of the programmable delay line 322, the transmission delay generated in the data signals RXDQ1, RXADD1, and RXCMD1 between the master circuit 310 and the slave circuit 320 may be compensated by delaying a slave path clock to one period. The transmission delay may be generated due to circuit elements in transmission paths, and in the interface device 300, the transmission delay generated due to the change of temperature and/or voltage may also be compensated through the adjustment action of the adjusting delay amount of the programmable delay line 322, so as to provide the correct sampling of the data signals RXDQ1, RXADD1, and RXCMD1.

It is worth mentioning that the sum of the adjusting delay amount provided by the programmable delay line 322, the matching delay amount provided by the delay matching circuit 3233, and the delay amount of the clock tree circuit CT3 may be substantially equal to one period of the clock signal CLK1. In this way, the transmission delay of the data signals RXDQ1, RXADD1, and RXCMD1 between the master circuit 310 and the slave circuit 320 can be effectively reduced. The delay amount of clock tree circuits CT1, CT2, and CT3 are substantially the same.

On the other hand, the slave circuit 320 may provide a clock signal SCLK_IN, generate a clock signal DQSR in response to the clock signal SCLK_IN through the delay locked loop 325 and the clock tree circuit CT5, and generate a clock signal DQSF in response to the clock signal SCLK_IN through the delay locked loop 326 and the clock tree circuit CT6.

The delay locked loop 325 and the delay locked loop 326 are coupled in parallel to receive the clock signal SCLK_IN. The delay locked loop 325 may be used to delay a phase of the clock signal SCLK_IN by 90 degrees to generate a signal S4. The delay locked loop 326 may be used to delay a phase of the clock signal SCLK_IN by 270 degrees to generate a signal S5. The clock tree circuits CT5 and CT6 are respectively coupled to the delay locked loops 325 and 326. The clock tree circuit CT5 receives the signal S4 and generates the clock signal DQSR according to the signal S4. The clock tree circuit CT6 receives the signal S5 and generates the clock signal DQSF according to the signal S5. In this embodiment, the delay locked loop 325 may make a phase shift with 180 degrees with the delay locked loop 326. That is, a phase of the clock signal DQSR may be earlier than a phase of the clock signal DQSF with 180 degrees.

In some embodiment, an inverter may be disposed in front of the delay locked loop 326 for making a phase shift with 180 degrees between the delay locked loop 326 and the delay locked loop 325, so that the delay locked loop 326 may receive an inverted clock signal SCLK_IN inverted by the inverter, and a delay line depth of the delay locked loop 326 may be reduced.

The clock signal DQSR and the clock signal DQSF are used to execute data acquisition action by different phases respectively. In addition, the delay matching circuit 324 may delay the clock signal SCLK_IN, and provide a clock signal in cooperation with the clock tree circuit CT4 as a basis for sending a data signal TXDQ2. The matching delay of the delay matching circuit 324 may be set substantially equal to the delay amount of each of the delay locked loops 325 and 326 with 0 degree.

The slave circuit 320 respectively send the data signal TXDQ2 and the clock signals DQSR and DQSF through silicon vias TSV5, TSV6, and TSV7.

In the embodiment, the master circuit 310 includes a phase detector 311, an output clock generator 312, and clock tree circuits CT9 and CT10. The output clock generator 312 includes programmable delay lines 3121 and 3122 and clock tree circuits CT7 and CT8. The programmable delay lines 3121 and 3122 are respectively coupled to through silicon vias TSV6 and TSV7 to respectively receive clock signals CLK2 and CLK3. The programmable delay lines 3121 and 3122 may receive the same adjust signal M_ADJ, and provide an adjusting delay amount according to the adjust signal M_ADJ. The programmable delay line 3121 delays the clock signal CLK2 according to the adjusting delay amount to generate a delayed clock signal, and provides the delayed clock signal to the clock tree CT7. The programmable delay line 3122 delays the clock signal CLK3 according to the adjusting delay amount to generate a delayed clock signal, and provides the delayed clock signal to the clock tree CT8. The clock trees CT7 and CT8 respectively generate sampling signals SP3 and SP4, and send the sampling signals SP3 and SP4 to a first-in first-out buffer (FIFO) 331. In this embodiment, a phase of the sampling signal SP3 may earlier than a phase of the sampling signal SP4 with 180 degrees. The FIFO 331 may store a data signal RXDQ2 obtained from the through silicon via TSV5 according to the sampling signals SP3 and SP4 with double data rate. In the other hand, a core circuit 330 may provide a clock signal MCLK_IN to the clock tree circuit CT10 and get the data signal RXDQ2 stored in the FIFO 331 by the clock tree circuit CT10 providing a sample signal to the FIFO 331. In here, the sum of the delay amount of the clock tree circuit CT7 and the adjusting delay amount provided by the programmable delay line 3121 is substantially equal to one period of the clock signal CLK2. The core circuit 330 may be implemented in the master circuit 310 or disposed external from the master circuit 310. In here, the adjusting delay amounts provided by the programmable delay lines 3121 and 3122 are substantially the same.

In addition, the phase detector 311 is coupled to the through silicon via TSV6 and the clock tree circuit CT7. The phase detector 311 receives the clock signal CLK2 from the through silicon via TSV6, and receives the sampling signal SP3 from the clock tree circuit CT7. The phase detector 311 detects a phase difference of the clock signal CLK2 and the sampling signal SP3 to generate phase lead or lag information PS2. The phase lead or lag information PS2 includes the related information of whether the phase of the sampling signal SP3 leads or lags the phase of the clock signal CLK2.

The master circuit 310 may generate the adjust signal M_ADJ according to the phase lead or lag information PS2, thereby adjusting the adjusting delay amount provided by the programmable delay lines 3121 and 3122. The programmable delay lines 3121 and 3122 may increase or decrease the adjusting delay amount according to the adjust signal M_ADJ, so that the sampling signals SP3 and SP4 may be center aligned with the data signal RXDQ2. In this way, the master circuit 310 may correctly sample the data signal RXDQ2 according to the sampling signals SP3 and SP4.

Please note here that through the adjustment action of the adjusting delay amount of the programmable delay lines 3121 and 3122, the transmission delay generated in the data signal RXDQ2 between the slave circuit 320 and the master circuit 310 may be compensated by delaying the clock signal CLK2 and the clock signal CLK3 to one period respectively. The transmission delay may be generated due to circuit elements in transmission paths, and in the interface device 300, the transmission delay generated due to the change of temperature and/or voltage may also be compensated through the adjustment action of the adjusting delay amount of the programmable delay lines 3121 and 3122, so as to provide the correct sampling of the data signal RXDQ2.

On the other hand, the clock tree circuits CT9 and CT10 are used to receive the clock signal MCLK_IN provided by the core circuit 330. According to clock signals generated by the clock tree circuit CT9, the master circuit 310 may respectively send data signals TXDQ1, TXADD1, and TXCMD1 and a clock signal TXCLK1 to the through silicon vias TSV1 to TSV4.

In FIG. 3B, different from FIG. 3A, the output clock generator 323 may include the delay locked loops 3231, the clock tree CT1 and an inverter Inv1. The inverter Inv1 is coupled to the clock tree CT1 for receiving the sampling signal SP1. The inverter Inv1 is used to generate the sampling signal SP2 by inverting the sampling signal SP1.

Different from FIG. 3A, the sampling signal SP4 in FIG. 3B may be generated by an inverter Inv2. The inverter Inv2 is coupled to the clock tree circuit CT7 and the FIFO 331. The inverter Inv2 is used to generate the sampling signal SP4 by inverting the sampling signal SP3.

Please be noted here, by using inverter Inv1 and Inv2 to respectively generate the sampling signal SP2 and the sampling signal SP4, the delay locked loop 3232, the clock tree circuit CT2, the delay locked loop 326, the clock tree circuit CT6, the programmable delay line 3122 and the clock tree circuit CT8 in FIG. 3A are not necessary in FIG. 3B. That is, a circuit size can be saved.

Figure 4:
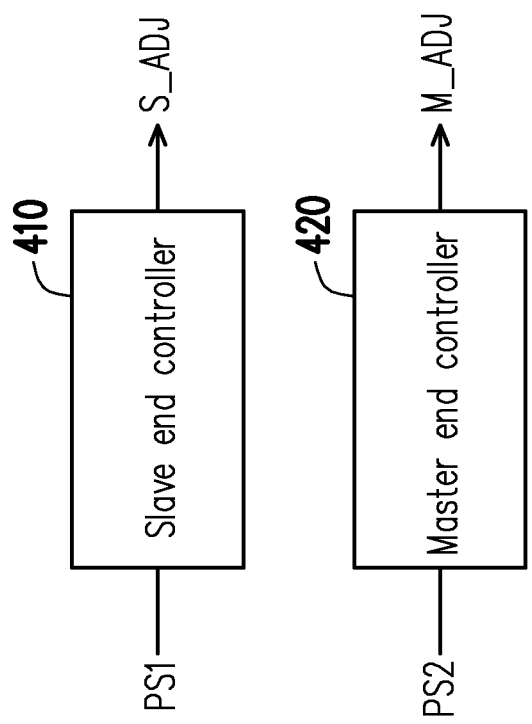
FIG. 4 is a schematic diagram of a generating manner of an adjust signal of an interface device according to an embodiment of the disclosure.

Please refer to FIG. 4 below. FIG. 4 is a schematic diagram of a generating manner of an adjust signal of an interface device according to an embodiment of the disclosure. In FIG. 4, an adjust signal S_ADJ in a slave circuit may be generated through a slave end controller 410, and an adjust signal M_ADJ in a master circuit may be generated through a master end controller 420. The slave end controller 410 may generate the adjust signal S_ADJ according to phase lead or lag information PS1 generated by a phase detector in the slave circuit, and the master end controller 420 may generate the adjust signal M_ADJ according to phase lead or lag information PS2 generated by the phase detector in the master circuit.

The slave end controller 410 and the master end controller 420 may be constructed through digital circuits and may be respectively disposed in the slave circuit and the master circuit. In other embodiments of the disclosure, the slave end controller 410 and the master end controller 420 may also be disposed outside the interface device, and there is no specific limitation.

Figure 5:
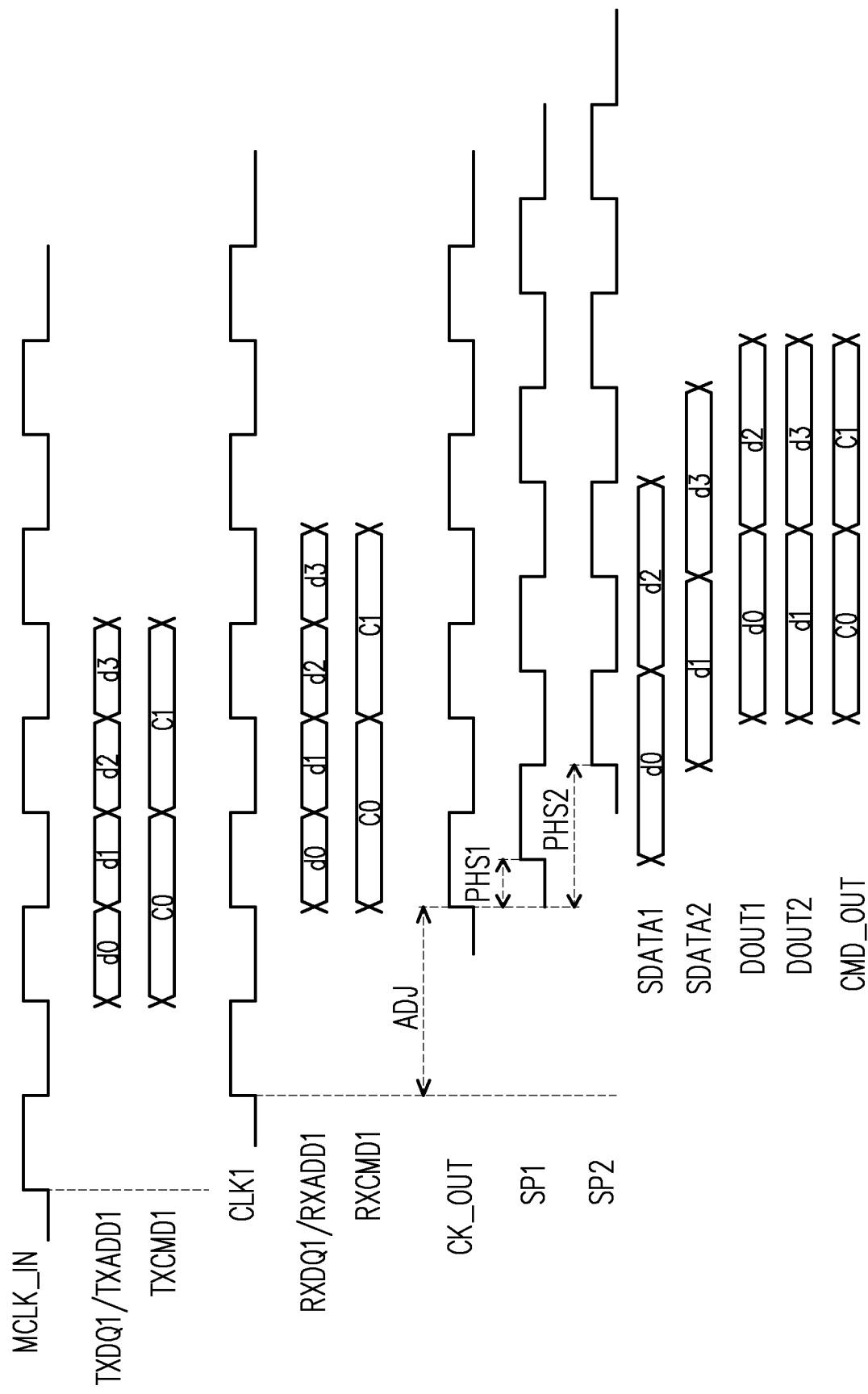
FIG. 5 is an action waveform diagram of the interface device according to the embodiment of FIG. 3 of the disclosure.

Please refer to FIG. 3A and FIG. 5 synchronously below. FIG. 5 is an operation waveform diagram of the interface device according to the embodiment of FIG. 3A of the disclosure. The master circuit 310 may send the data signal TXDQ1/TXADD1 and TXCMD1 to the slave circuit 320 based on the clock signal MCLK_IN. Due to the transmission delay generated by the transmission path between the master circuit 310 and the slave circuit 320, there is a certain degree of clock shift between the clock signal MCLK_IN and the clock signal CLK1 received by the slave circuit 320, and there is also a certain degree of shift between the data signals TXDQ1/TXADD1, TXCMD1 and the data signal RXDQ1/RXADD1 and RXCMD1 received by the slave circuit 320. Through the adjustment action of the programmable delay line 322, the slave circuit 320 may generate the clock signal CK_OUT and the sampling signals SP1 and SP2. By a delay provided by the programmable delay line 322, the delay matching circuit 3233 and the clock tree circuit CT3, there is a phase shift ADJ between the clock signal CLK1 and the clock signal CK_OUT, and the phase shift ADJ may be substantially equal to one period of the clock signal CLK1. Based on the clock signal CK_OUT, if the clock signal CK_OUT has a phase shift with 0 degree, the sampling signal SP1 may have a phase shift PHS1 with 90 degrees and the sampling signal SP1 may have a phase shift PHS2 with 270 degrees.

By sampling the data signal RXDQ1 respectively by the sampling signals SP1 and SP2, sampled data SDATA1 and SDATA2 may be obtained. Also, the slave circuit 320 may re-sample the sampled data SDATA1 and SDATA2 by the clock signal CK_OUT, and sample the data signal RXCMD1 by the clock signal CK_OUT, so that output data DOUT1, DOUT2 and output command CMD_OUT with aligned transition edges can be obtained.

Figure 6:
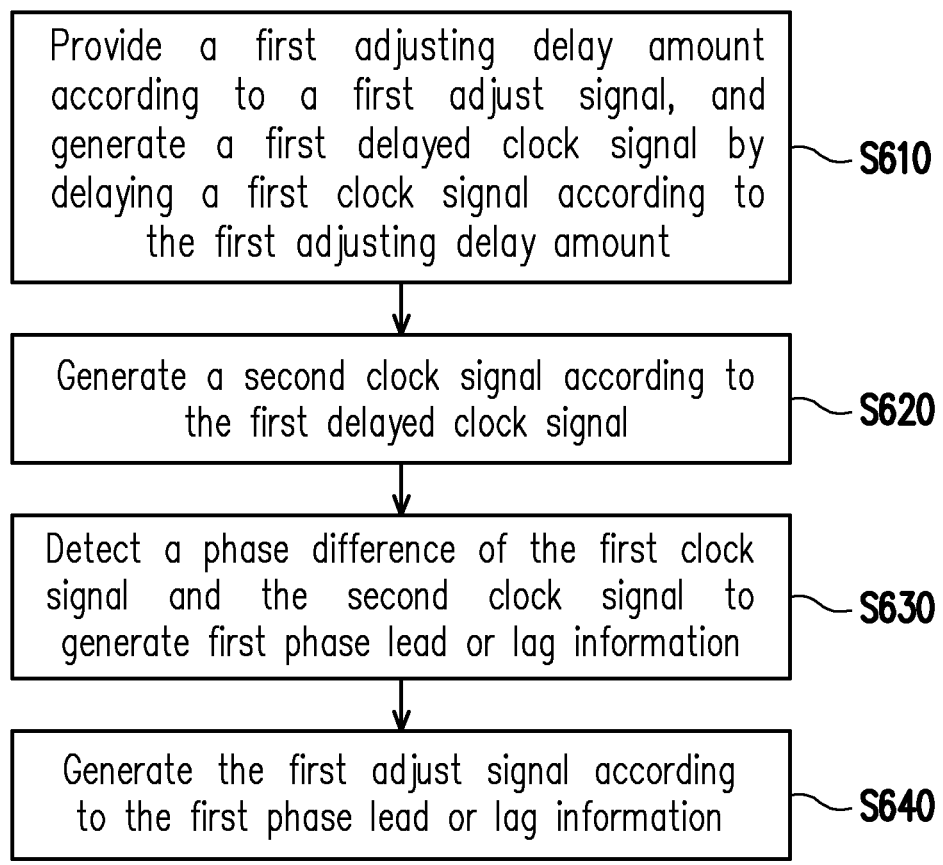
FIG. 6 is a flowchart of a signal transceiving method of an interface device according to an embodiment of the disclosure.

Please refer to FIG. 6. FIG. 6 is a flowchart of a signal transceiving method of an interface device according to an embodiment of the disclosure. An interface device is suitable for use as a communication medium between a master circuit and a slave circuit in a three-dimensionally stacked semiconductor element. In Step S610, the slave circuit may provide a first adjusting delay amount according to a first adjust signal, and generate a first delayed clock signal by delaying a first clock signal according to the first adjusting delay amount. Next, in Step S620, a second clock signal is generated according to the first delayed clock signal. Also, in Step S630, a phase difference of the first clock signal and the second clock signal is detected to generate first phase lead or lag information. Furthermore, in Step S640, the first adjust signal is generated according to the first phase lead or lag information. The implementation details of the above steps have been described in detail in the foregoing embodiments and will not be repeated below.

In summary, the interface device of the disclosure sets the adjusting delay amount according to the adjust signal through the programmable delay line, and delays the clock signal according to the adjusting delay amount, so that the clock signal may be aligned with the data signal, and the incoming data signal can be effectively sampled. Through delaying the clock signal, the interface device of the disclosure does not need to dispose delay lines for multiple bits of the data signal, which can effectively reduce the requirement of circuit layout area and reduce the required power consumption to improve the work efficiency of the semiconductor element.

What is claimed is:

1. An interface device for a semiconductor device, the semiconductor device including a master device and a plurality of slave devices, wherein the master device and the slave devices are stacked up with electric connection to form a three-dimension structure, the interface device comprising:
a master circuit implemented in the master device; and
a slave circuit implemented in each of the slave devices, coupled to the master circuit through a plurality of through silicon vias, the slave circuit comprising:
a first programmable delay line, providing a first adjusting delay amount according to a first adjust signal, and generating a first delayed clock signal by delaying a first clock signal according to the first adjusting delay amount;
a first output clock generator, coupled to the first programmable delay line and generating a second clock signal according to the first delayed clock signal; and
a first phase detector, detecting a phase difference of the first clock signal and the second clock signal to generate first phase lead or lag information,
wherein the first adjust signal is generated according to the first phase lead or lag information,
wherein the first output clock generator comprises:
a first delay locked loop, coupled to the first programmable delay line and delaying a phase of the first delayed clock signal to generate a first signal;
a first clock tree circuit, coupled to the first delay locked loop and generating a first sampling signal according to the first signal;
a delay matching circuit, coupled to the programmable delay line and providing a matching delay amount to delay the first delayed clock signal to generate a second signal; and
a second clock tree circuit, coupled to the delay matching circuit and generating the second clock signal according to the second signal.

2. The interface device according to claim 1, wherein the first output clock generator further comprises:
a second delay locked loop, coupled to the first programmable delay line and delaying a phase of the first delayed clock signal to generate a third signal; and
a third clock tree circuit, coupled to the second delay locked loop and generating a second sampling signal according to the third signal.

3. The interface device according to claim 1, wherein the first output clock generator further comprises:
an inverter, coupled to the first clock tree circuit, generating a second sampling signal according to the first sampling signal.

4. The interface device according to claim 1, wherein a sum of the first adjusting delay amount, the matching delay amount, and a delay amount of the second clock tree circuit is substantially equal to a period of the first clock signal.

5. The interface device according to claim 1, further comprising:
a slave end controller, generating the first adjust signal according to the first phase lead or lag information.

6. The interface device according to claim 1, wherein the master circuit comprises:
a second output clock generator, receiving a third clock signal by the slave circuit and generating a second sampling signal according to a second adjust signal; and
a second phase detector, detecting a phase difference of the third clock signal and the second sampling signal to generate second phase lead or lag information,
wherein the second adjust signal is generated according to the second phase lead or lag information.

7. The interface device according to claim 6, wherein the second output clock generator comprises:
a second programmable delay line, providing a second adjusting delay amount according to the second adjust signal, and generating a third signal by delaying the third clock signal according to the second adjusting delay amount; and
a first clock tree circuit, generating the second sampling signal according to the third signal.

8. The interface device according to claim 7, wherein the second output clock generator further comprises:
a third programmable delay line, generating a fourth signal by delaying a fourth clock signal received from the slave circuit according to the second adjusting delay amount; and
a second clock tree circuit, generating a third sampling signal according to the fourth signal.

9. The interface device according to claim 7, wherein the second output clock generator further comprises:
an inverter, coupled to the first clock tree circuit, generating a third sampling signal by inverting the first sampling signal.

10. The interface device according to claim 7, wherein a sum of a delay amount of the first clock tree circuit and the second adjusting delay amount provided by the second programmable delay line is substantially equal to a period of the third clock signal.

11. The interface device according to claim 6, further comprising:
a master end controller, generating the second adjust signal according to the second phase lead or lag information.

12. A signal transceiving method, adapted for a semiconductor device including a master device and a plurality of slave devices, wherein the master device and the slave devices are stacked up with electric connection, comprising:
receiving a first clock signal from a master circuit of the master device by a slave circuit of each of the slave devices;
providing a first adjusting delay amount according to a first adjust signal, and generating a first delayed clock signal by delaying the first clock signal according to the first adjusting delay amount;
generating a second clock signal according to the first delayed clock signal;
detecting a phase difference of the first clock signal and the second clock signal to generate first phase lead or lag information;
generating the first adjust signal according to the first phase lead or lag information;
delaying a phase of the first delayed clock signal by a first delay locked loop to generate a first signal;
generating a first sampling signal according to the first signal by a first clock tree circuit;
providing a matching delay amount by a delay matching circuit to generate a second signal by delaying the delayed clock signal, wherein the matching delay amount is equal to a delay amount provided by the first delay locked loop with 0 degree; and generating the second clock signal according to the second signal by a second clock tree circuit.

13. The signal transceiving method according to claim 12, further comprising:
   delaying a phase of the first delayed clock signal by a second delay locked loop to generate a third signal; and
   generating a second sampling signal according to the third signal by a third clock tree circuit.

14. The signal transceiving method according to claim 12, further comprising:
   inverting the first sampling signal by an inverter to generate a second sampling signal.

15. The signal transceiving method according to claim 12, wherein a sum of the first adjusting delay amount, the matching delay amount, and a delay amount of the second clock tree circuit is substantially equal to a period of the first clock signal.

16. The signal transceiving method according to claim 12, further comprising:
   receiving a third clock signal from the slave circuit of each of the slave devices, and generating a first sampling signal according to a second adjust signal by the master circuit of the master device;
   detecting a phase difference of the third clock signal and the first sampling signal to generate second phase lead or lag information; and
   generating the second adjust signal according to the second phase lead or lag information.

17. The signal transceiving method according to claim 16, further comprising:
   receiving a fourth clock signal from the slave circuit of each of the slave devices, and generating a second sampling signal according to the second adjust signal.

18. The signal transceiving method according to claim 16, further comprising:
   inverting the first sampling signal by an inverter to generate a second sampling signal.

* * * * *